(12) United States Patent
Walter

(10) Patent No.: US 7,224,204 B2
(45) Date of Patent: May 29, 2007

(54) METHOD AND CIRCUIT FOR DRIVING A GATE OF A MOS TRANSISTOR NEGATIVE

(75) Inventor: William Louis Walter, Lowell, MA (US)

(73) Assignee: Linear Technology Corporation, Milpitas, CA (US)

( * ) Notice: Subject to any disclaimer, the term of this patent is extended or adjusted under 35 U.S.C. 154(b) by 50 days.

(21) Appl. No.: 11/073,722

(22) Filed: Mar. 8, 2005

(65) Prior Publication Data

US 2006/0202737 A1     Sep. 14, 2006

(51) Int. Cl.
*H03K 17/687* (2006.01)

(52) U.S. Cl. .................... 327/427; 327/108; 327/535; 326/82

(58) Field of Classification Search ............. None
See application file for complete search history.

(56) References Cited

U.S. PATENT DOCUMENTS

| | | | | |
|---|---|---|---|---|
| 5,426,334 A | * | 6/1995 | Skovmand | 327/427 |
| 5,592,117 A | * | 1/1997 | Nadd | 327/374 |
| 5,828,262 A | * | 10/1998 | Rees | 327/390 |
| 6,362,677 B1 | | 3/2002 | Petrofsky | |
| 6,400,209 B1 | * | 6/2002 | Matsuyama et al. | 327/534 |
| 6,411,531 B1 | | 6/2002 | Nork et al. | |
| 6,438,005 B1 | | 8/2002 | Walter | |
| 6,452,441 B1 | * | 9/2002 | Kim et al. | 327/544 |
| 6,657,477 B2 | * | 12/2003 | Hughes | 327/534 |
| 6,781,422 B1 | * | 8/2004 | Yang | 327/108 |
| 6,836,173 B1 | * | 12/2004 | Yang | 327/390 |
| 6,975,146 B1 | * | 12/2005 | Schottler | 327/108 |

* cited by examiner

*Primary Examiner*—Timothy P. Callahan
*Assistant Examiner*—An T. Luu
(74) *Attorney, Agent, or Firm*—McDermott Will & Emery LLP

(57) ABSTRACT

A method and circuit for driving the gate of a MOS transistor having a negative or low threshold voltage negative, in which the driving circuit is formed on a single chip. A negative voltage is generated from a positive voltage to drive the gate of the MOS transistor negative. The MOS transistor may be a native NMOS transistor, and the negative voltage is generated for increasing source-drain impedance of the native NMOS transistor. On the other hand, the MOS transistor may be a PMOS transistor, and the negative voltage is generated for reducing source-drain impedance of the PMOS transistor. The MOS transistor can be used as an open-drain switch or a source follower.

14 Claims, 5 Drawing Sheets

METHOD AND CIRCUIT FOR DRIVING A GATE OF A MOS TRANSISTOR NEGATIVE

TECHNICAL FIELD

This disclosure is related generally to a method and circuit for driving the gate of a MOS transistor negative. More specifically, the disclosure relates to circuitry for providing negative on-chip voltage to reduce source-drain leakage of low gate threshold MOS transistors and enhance drive capabilities of PMOS transistors.

BACKGROUND

The electronics industry has seen a trend toward applications running at increasingly lower supply voltages while input current requirements often remain high. This has been especially true in battery powered applications which can run from a supply as low as a single volt, while peak current requirements can be as high as an amp. This trend has been pushed by the electronics industry increasing use of finer and finer geometry CMOS processes. The trend of lower supply voltages has made it difficult for power circuits to drive these applications. Due to factors such as expense and high metal impedance, power and analog ICs tend to lag current state of the art CMOS processes by several generations. Thus, the threshold voltage of MOS devices used in power and analog ICs can be on the order of the supply voltage they are running from or output voltage they are trying to provide. This makes it very difficult to provide high current output functions.

The low threshold voltage ($V_T$) of a native NMOS transistor may be very useful as a source follower or open drain output device because the transistor provides a lower channel resistance than that of a non-native NMOS transistor given the same gate drive. However, native NMOS transistors are generally not used as output devices because an open drain output can leak significantly with a zero gate-source voltage and a source follower output voltage can be positive with a zero gate voltage (i.e., an output voltage may exist when it is supposed to be shutdown).

For low input supplies on the order of the threshold voltage $V_T$ of PMOS transistors, it is sometimes impractical to provide a low enough source-drain impedance necessary for high output current applications. The $V_T$ of a PMOS transistor can be reduced by changing the doping of the PMOS channel to provide lower source-drain impedance. Adjusting the PMOS channel doping is usually undesirable or impractical though.

The need thus exists for a method that provides adequate means to ensure turn-off low voltage threshold NMOS transistors as well as a method for providing enhanced PMOS transistor drive, particularly if the device supply is of low voltage.

SUMMARY

The subject matter described herein fulfills the above-described needs of the prior art. A MOS transistor, supplied by a positive voltage source, is driven to a non-conductive state by application to its gate of a negative voltage generated in response to an enable signal. A driving circuit includes a negative voltage generator, which may comprise a charge pump circuit. A gate is coupled to a signal input node to deactivate the negative voltage generator in the absence of an enable signal at the signal input node. The negative voltage may be applied to the gate of a native NMOS transistor, or low gate threshold level NMOS transistor, to increase source-drain impedance of the native NMOS transistor. The negative voltage may be applied to the gate of a PMOS transistor, to reduce source-drain impedance of the PMOS transistor.

The charge pump circuit may comprise a capacitor, a current source, and a logic circuit. When the negative voltage generator is activated, during occurrence of the enable signal, the logic circuit is responsive to the voltage of the capacitor to cause the capacitor, alternatively, to be charged by the voltage supply or to be connected to the current source and the gate of the MOS transistor.

In one embodiment, a first switching device is connected between a first capacitor electrode and a supply input node. A second switching device is connected between a second capacitor electrode a common potential. The capacitor is charged when the switching devices are rendered conductive. A third switching device is connected between the second capacitor electrode and the gate of the MOS transistor. A fourth switching device is connected between the first capacitor electrode and the current source for driving the gate of the MOS transistor negative when the second capacitor electrode is connected to the gate of the MOS transistor. The logic circuit includes a monitoring circuit responsive to the voltage of the first capacitor electrode for controlling the first to fourth switching devices alternately to charge the capacitor and drive the gate voltage of the MOS transistor negative.

The MOS transistor may be configured as an open-drain switch. A fifth switching device may be connected between the input node and the gate of the MOS transistor for applying a positive voltage to the gate of the MOS transistor in response to a disable signal at the signal input node.

Alternatively, the MOS transistor may be configured as a source follower. An amplifier may be connected to receive a reference voltage and an output of the MOS transistor. A fifth switching device is connected between an output of the amplifier and the gate of the MOS transistor. The fifth switching device is controlled to conduct in response to a disable signal at the signal input node.

In another embodiment, the fourth switching device connected between the first capacitor electrode and the common potential and the current source is eliminated. The MOS transistor is a PMOS transistor configured as an open-drain switch. A fifth switching device is connected between the input node and the gate of the MOS transistor for applying a positive voltage to the gate of the MOS transistor in response to a disable signal at the signal input node. The switching devices in any of the embodiments may comprise MOS transistors, bipolar transistors, and/or JFET transistors.

Additional aspects and advantages of the present disclosure will become readily apparent to those skilled in the art from the following detailed description, wherein only exemplary embodiments of the present disclosure is shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

Implementations of the present invention are illustrated by way of example, and not by way of limitation, in the figures of the accompanying drawings, in which like reference numerals refer to similar elements.

DETAILED DESCRIPTION

With reference to accompanying drawings, a driving circuit for driving the gate of a MOS transistor negative will be described. A negative voltage is generated to drive the gate of, for example, a native NMOS transistor or a PMOS transistor, negative to increase or decrease source-drain impedance respectively.

Components readily available on most IC processes, i.e., poly-poly and gate capacitors, MOS, bipolar, and JFET transistors, for example, are utilized to form a driving circuit on a single chip. The use of on chip components is desirable as it does not require additional external components and IC pins, which generally increase application size and cost. The driving circuit may be used in a single supply application having a single low positive voltage supply, and configured for driving the gate of a MOS transistor negative, for example, with a negative charge pump circuit.

Figure 1:
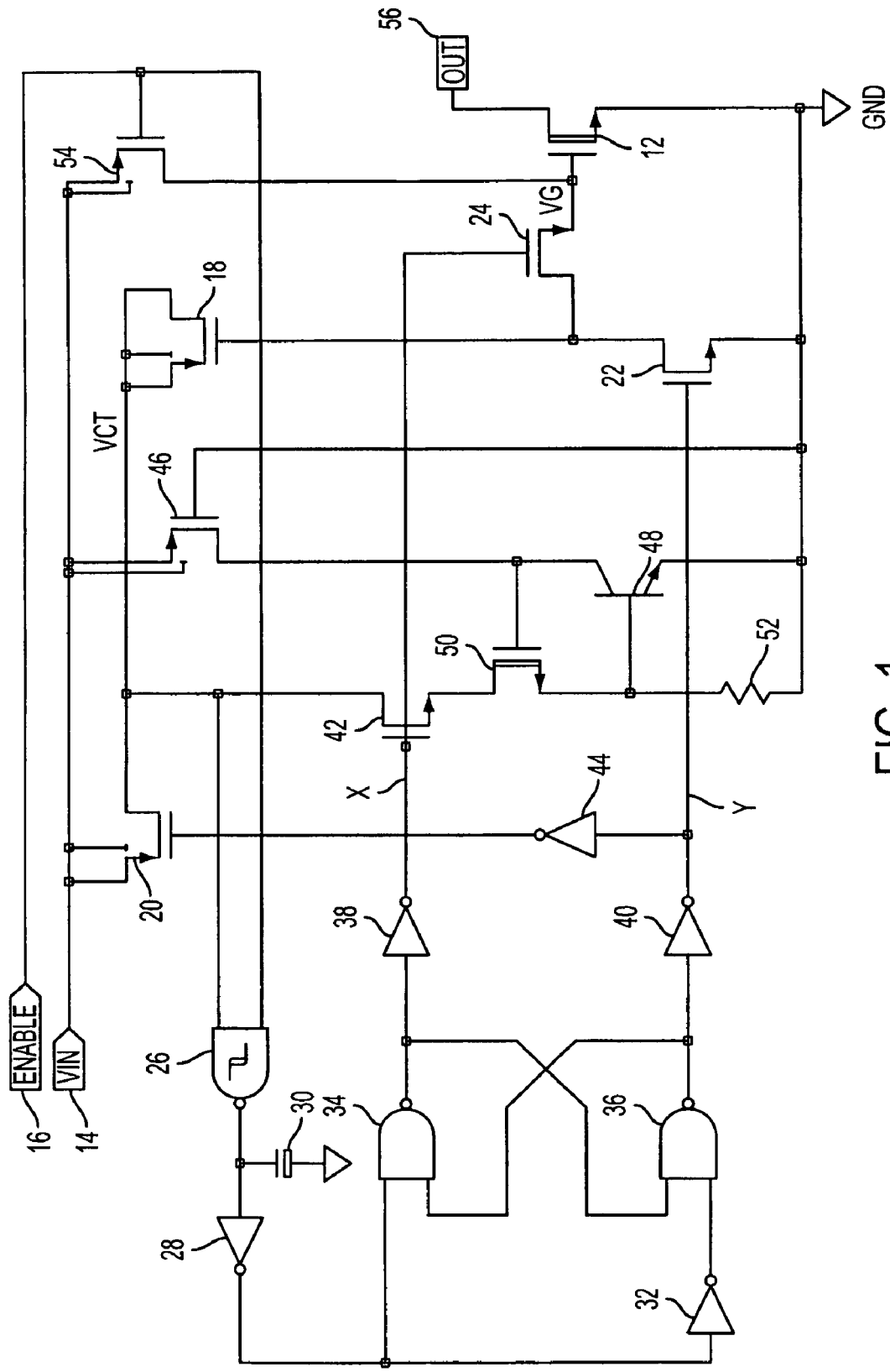
FIG. 1 is a circuit diagram illustrative of one embodiment of the invention.

FIG. 1 is an example of a circuit topology illustrating an open-drain native switch with a driving circuit. A driving circuit 10 is provided to drive the gate of a native NMOS 12 negative to increase source-drain impedance of the transistor when it is to be in a non-conducting state. Transistor 12 is used as an open-drain output device in this embodiment. Driving the gate of native NMOS 12 to a negative voltage level significantly reduces leakage of an open drain output Node or terminal (hereinafter "node") 14 is a low positive voltage supply input node. Node or terminal 16 is coupled to receive an ENABLE voltage signal. Node 16 is connected to the gate of PMOS transistor 54 and to an input of NAND gate 26. Transistor 54 is connected between input node 14 and the gate of transistor 12. The driving circuit is activated in response to a logic High ENABLE signal at node 16 to apply negative voltage to the gate of transistor 12. When a logic Low Enable signal exists at node 16, a positive voltage is applied, through activation of switch 54, to the gate of transistor 12 to drive it to a conductive state. At this time, NAND gate 26 prevents the driving circuit from applying negative voltage to the gate of transistor 12.

PMOS element 18 is a capacitor with a top electrode connected to the drain of PMOS transistor 20 and a bottom electrode connected to ground GND through NMOS transistor 22. The bottom electrode is also connected to the gate of native NMOS transistor 12 through NMOS transistor 24. The source of PMOS transistor 20 is connected to input node 14. When transistors 20 and 22 are conductive, capacitor 18 is charged by virtue of its connection between the input node and ground.

Connected in series between the top electrode of capacitor 18 and ground are transistor 42, NMOS transistor 50, and resistor 52. Connected in series between the input node and ground are PMOS transistor 46 and bipolar transistor 48. The gate of transistor 46 is connected to ground. The gate of transistor 50 is connected to the collector of transistor 48.

The base of transistor 48 is connected to the source of transistor 50. Transistor 50, resistor 52 and bipolar transistor 48 form a fixed current source that provides a current $I_{50}=V_{BE48}/R_{52}$.

When transistors 20 and 22 are turned off, the gates of transistors 42 and 24 may be activated to connect capacitor 18 between the current source and the gate of transistor 12. The current source will then sink current from the top electrode of capacitor 18 to drive the gate voltage of transistor 12 negative. The voltage level at the top electrode of capacitor 18 is monitored by a logic circuit through NAND gate 26, which has its second input connected to the capacitor 18.

The logic circuit is configured with the output of NAND gate 26 connected to inverter 28. Capacitor 30, connected to the output of NAND gate 26 creates a short delay in the NAND output signal. The output of inverter 28 is connected to an input of NAND gate 34 and to inverter 32. The output of inverter 32 is connected to an input of NAND gate 36. Cross coupled NAND gates 34, 36 constitute a latch circuit to latch an output of NAND gate 26. The output of NAND gate 34 is connected through an inverter 38 to a node X to which gates of NMOS transistors 24, 42 are connected. The output of NAND gate 36 is connected through an inverter 40 to a node Y to which the gate of NMOS transistor 22 is connected and the gate of PMOS transistor 20 is connected through an inverter 44.

In operation, NAND gate 26 disables driving circuit 10 when the voltage level of node 16 is low, representing a disable signal. Native NMOS transistor 12 also remains in the ON state since transistor 54 pulls the gate of native NMOS transistor 12 positive. The gate of native NMOS transistor 12 may be pulled up to the level of an input voltage $V_{IN}$, for example.

When the voltage level of ENABLE node 16 becomes high, driving circuit 10 is then activated. NAND 26 is configured with an inherent hysteretic threshold. When the voltage level at the first electrode of capacitor 18 is below the input logic low threshold of NAND 26, NAND 26 produces a high logic level at its output. Inverters 28, 32, cross coupled NAND gates 34 and 36, and inverters 38 and 40 produce a low logic level at node X and a high logic level at node Y. Circuit is then in a charging phase. The low logic level at node X turns off transistors 24 and 42. The high level at node Y turns on transistor 22 and transistor 20 via inverter 44. Capacitor 18 is then connected between the input node and ground and charged.

When capacitor 18 is charged to voltage $V_{IN}$, the logic level is high at both inputs to NAND gate 26 and the operating mode of the driving circuit 10 transitions from the charging phase to a driving phase. The logic circuit provides a high logic level to node X and a low logic level to node Y. These levels cause transistors 20 and 22 to turn off and transistor 24 and 42 to turn on. The capacitor and constant current source, which are now coupled to the gate of transistor 12, drive the gate to a negative level. When the voltage at capacitor 18 drops to the low threshold voltage level of NAND 26, driving circuit 10 transitions back to the charging phase.

In the absence of a negative voltage supply, a parasitic diode can exist between the gate of the native NMOS transistor 12 and ground GND. The source and drain of NMOS transistor 24 may act as a parasitic diode to ground GND on a p-type wafer where the substrate is connected to ground GND. This diode limits how low the gate of native NMOS transistor 12 can be driven below ground GND and can tend to discharge the gate of the native NMOS transistor when not in the driving phase. An exemplary benefit of the driving circuit 10 in FIG. 1 is that the circuit has a short charge phase, which limits how much gate charge is leaked off before returning to the driving phase.

Figure 2:
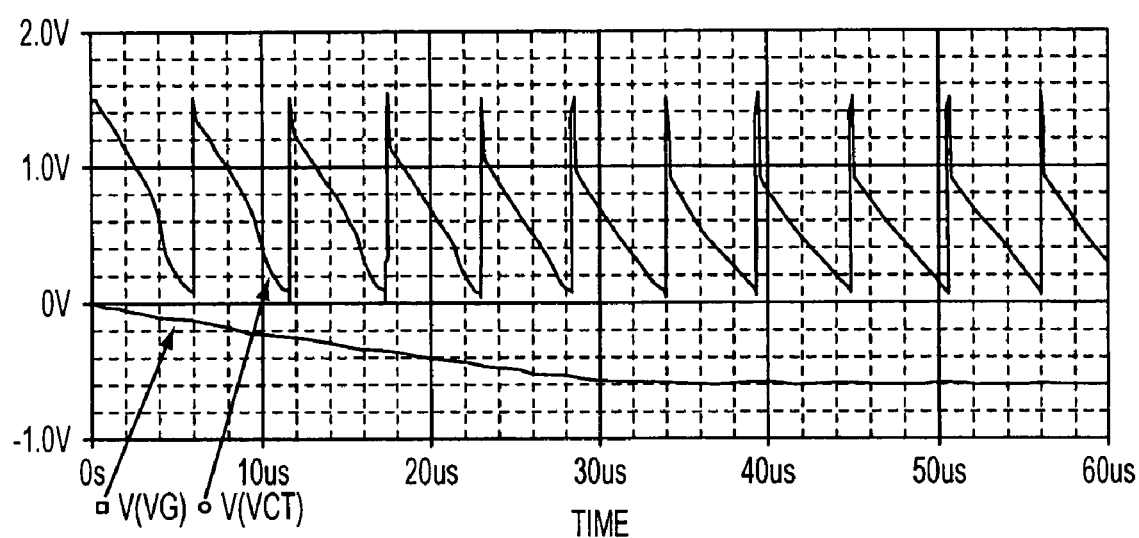
FIG. 2 is a diagram of waveforms for operation of the circuit of in FIG. 1.

FIG. 2 illustrates an example of operating waveforms of driving circuit 10 with input voltage $V_{IN}$ of 1.5V, where a voltage $V_{CT}$ of the top electrode of capacitor 18 and a gate voltage $V_G$ of native NMOS transistor 12 are shown. The fixed current ($I_{50}=V_{BE48}/R_{52}$) in the driving phase sets operation current of driving circuit 50 (which is approximately $I_{50}$) and in conjunction with capacitor 18 sets the length of the driving phase. Fixed current $I_{50}$ will drive the gate of native NMOS transistor 12 lower at the expense of increased supply current of driving circuit 10. Capacitor 18 can be made larger to lengthen the time of the driving phase, but this is generally at the expense of an IC area.

All the components shown in FIG. 1 may be incorporated on a single monolithic IC. Capacitor 18 shown in FIG. 1 is a PMOS gate capacitor, but can be replaced with several types of chip capacitance such as poly-ploy capacitance. Generally, it is desirable to use materials which provide the highest capacitance per unit area, but the parasitic capacitance to ground GND should be considered. The parasitic capacitance may tend to reduce the effective charge transferred to the gate of native NMOS transistor 12. Moreover, transistors 20, 22, 24, 42, 46 and 54 are MOS transistors in FIG. 1. The same function can be achieved through use of other types of transistors such as bipolar transistors and JFETs.

In addition, it will be appreciated by persons skilled in the art that many design modifications may be made to the circuit topology shown in FIG. 1, while retaining its function. For example, NMOS transistor 42 may be omitted, connecting the drain of transistor 50 directly to the top electrode of capacitor 18. This modification may increase supply current to driving circuit 10 slightly because current $I_{50}$ is not turned off during the charging phase. However, such increase is negligible if the driving phase is significantly longer than the charge phase.

It will also be appreciated by persons skilled in the art that the circuit topology shown in FIG. 1 can be applied to drive the gate of a PMOS transistor negative to reduce source-drain impedance. This may be accomplished by replacing native NMOS 12 with a PMOS transistor with slight modification. The source of a PMOS transistor can be connected to input node 14, thus allowing an open drain configuration.

Figure 3:
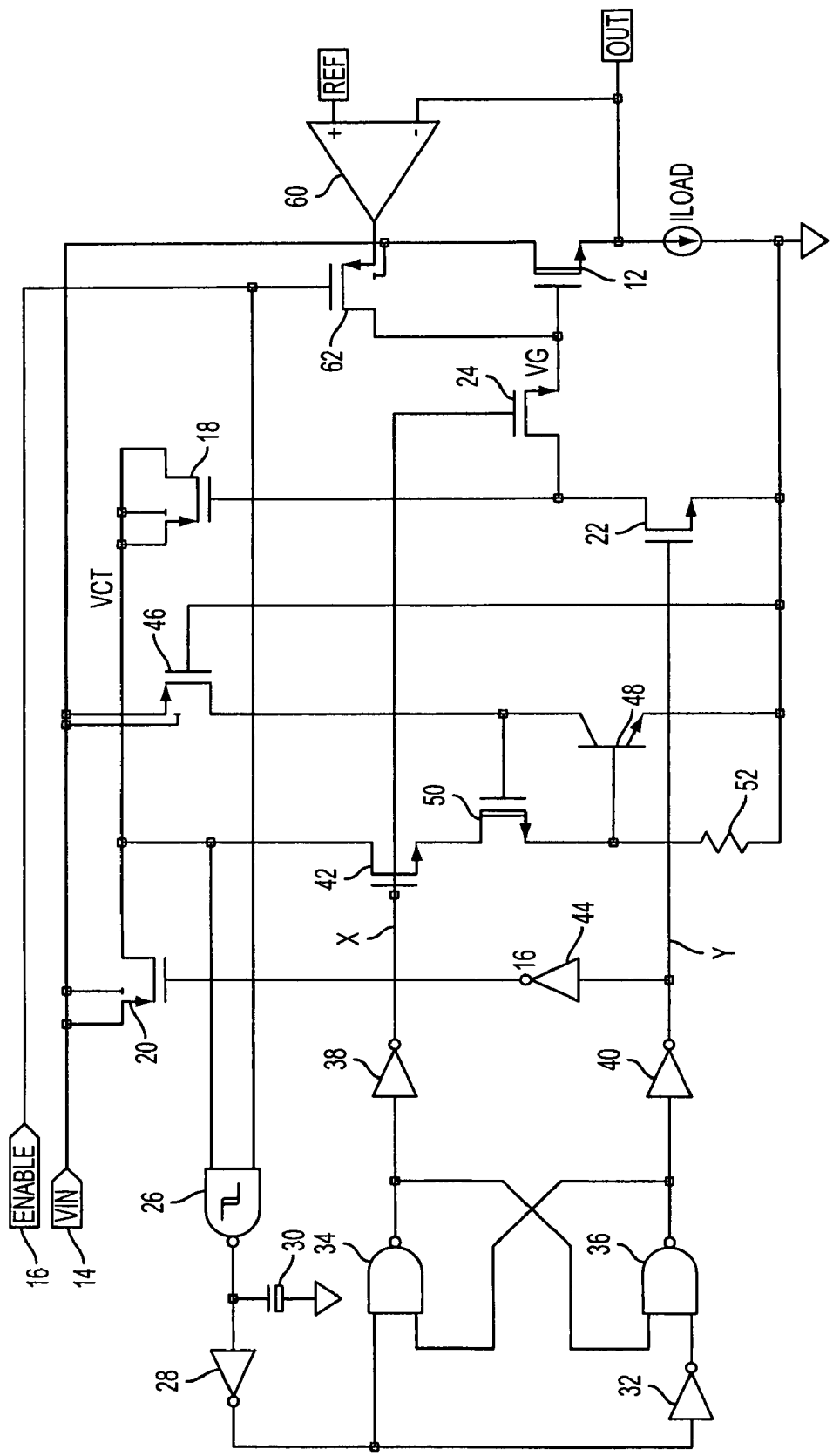
FIG. 3 is a diagram of a circuit that is a variation of the circuit of FIG. 1.

FIG. 3 is an example of a circuit topology illustrating a source follower output with driving circuit 10, in which a low threshold native NMOS 12 is used as a source follower output. A negative or low threshold voltage native NMOS 12 allows for higher programmed output voltages and enhances output drive capabilities. The circuit topology of driving circuit 10 is the same as that shown in FIG. 1 except for elements for turning on or off native NMOS transistor 12.

In FIG. 3, driving circuit 10 includes an amplifier 60 and a PMOS transistor 62. To the inverting input of amplifier 60, a reference voltage is supplied and to the non-inverting input of the amplifier, a source voltage of native NMOS transistor 12 is provided. PMOS transistor 62 may connect an output of amplifier 60 to the gate of native NMOS transistor 12 to drive the gate positive for reduce source-drain impedance of the native NMOS transistor. Accordingly, native NMOS transistor 12 is turned on.

In operation, when a voltage level of the ENABLE node 16 is high, driving circuit 10 is activated and the gate of NMOS is driven below ground GND to turn it off, as explained above with reference to FIG. 1. When the voltage level of on/off node 16 becomes low, driving circuit 10 is disabled through NAND gate 26, and the gate of native NMOS transistor 12 is coupled to amplifier 60 through PMOS transistor 62. Amplifier 60 drives the gate of native NMOS transistor 12 such that the source of native NMOS transistor 12 becomes equal to the reference voltage REF. It will be appreciated for persons skilled in the art that FIG. 3 illustrates how native NMOS transistor 12 could be used for a low drop out regulator. Note that the circuit topology shown in FIG. 3 is almost the same as that shown in FIG. 1, explanation of the driving circuit itself is omitted for brevity.

Figure 4:
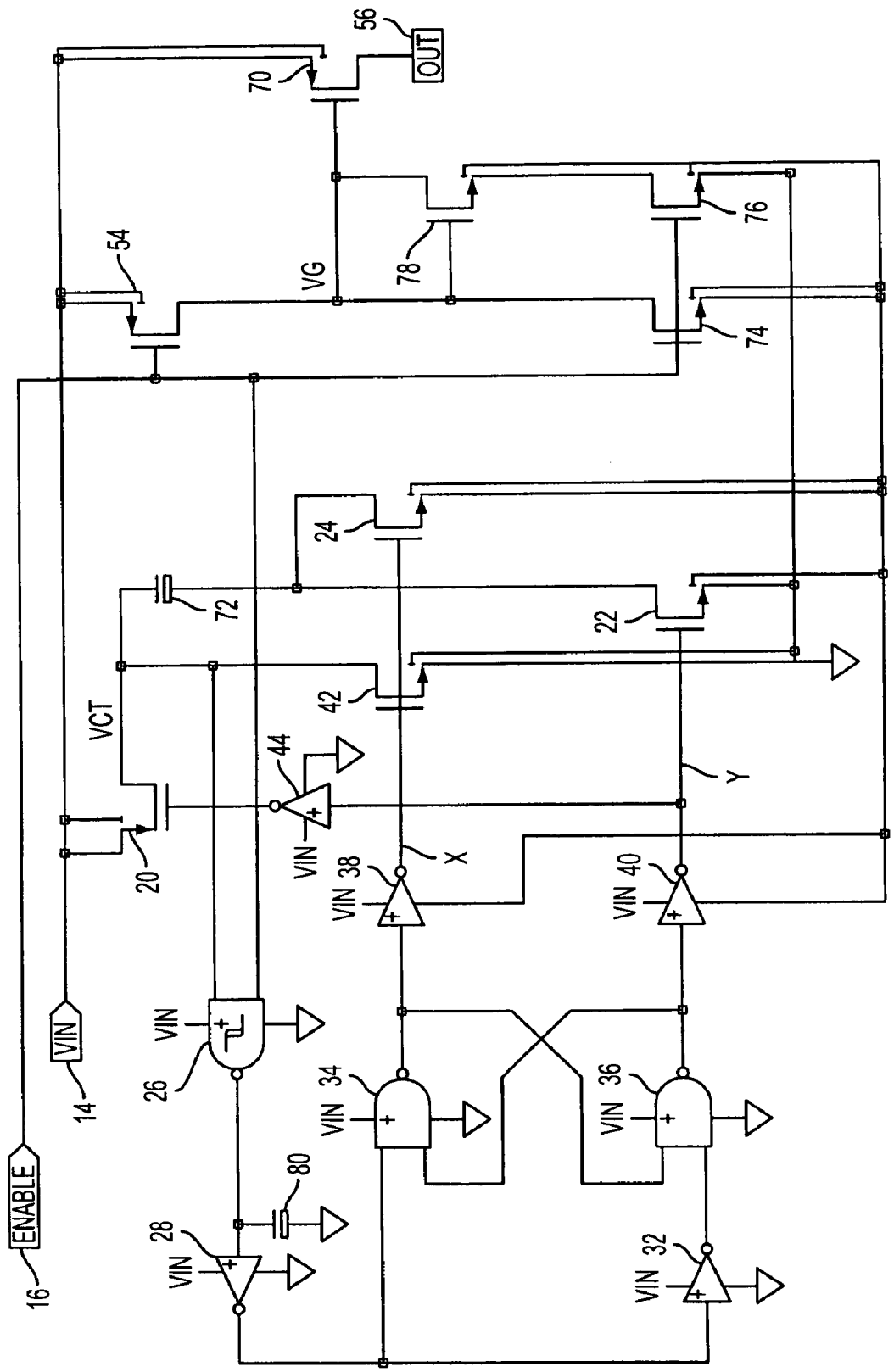
FIG. 4 is a circuit diagram illustrative of another embodiment of the invention.

If an n-type wafer, junction isolated, or twin well process is available, it is possible to eliminate the parasitic diode discussed above, allowing the gate of a MOS transistor to be driven to even lower voltage. A circuit topology shown in FIG. 4 may be implemented to avoid the parasitic diode. FIG. 4 illustrates an example of a circuit topology illustrating an open-drain switch with a driving circuit according to another embodiment of the disclosure.

In FIG. 4, the gate of a PMOS transistor 70 is driven negative by driving circuit 10 in which explanation for the same elements shown in FIG. 1 will be omitted for brevity. In this embodiment, the gate of PMOS transistor 70 can be driven even further below ground GND since there is no parasitic elements to remove charge from the gate of PMOS transistor 70. The gate of PMOS transistor 70 may be driven as much as minus input voltage ($-V_{IN}$) below ground GND.

As in FIG. 1, ENABLE node 16 may be used to turn on or off PMOS transistor 70, and activate or deactivate driving circuit 10 through NAND gate 26. For example, when the voltage level of ENABLE node 16 is high, the gate of PMOS transistor 70 is driven negative ("ON state") to reduce source-drain impedance. This creates a low impedance path from input node 14 to output node 56. On the other hand, when the voltage level of ENABLE node 16 is low, the gate of PMOS transistor 70 is driven positive ("OFF state") by PMOS transistor 54 to increase source-drain impedance. This creates a high impedance path from input node 14 to output node 56.

Referring to FIG. 4, driving circuit 10 includes a poly-poly capacitor 72 instead of PMOS gate capacitor 18 in FIG. 1. The fixed current source comprising native NMOS transistor 50, bipolar transistor 48 and resistor 50 of FIG. 1 are omitted in FIG. 4. Because there is no parasitic diode to remove charge from the gate of PMOS transistor 70, time necessary for switching between the charging phase and the driving phase can be minimized. Accordingly, the fixed current source is not necessary.

Transistor 74 is connected between NMOS transistor 24 and PMOS transistor 54. When the voltage level of ENABLE node 16 is high, NMOS transistor 74 is turned on to connect the bottom electrode of capacitor 72 to the gate of PMOS transistor 70 to drive the gate negative, together with NMOS transistor 24. When the voltage level of ENABLE node 16 is low, NMOS transistor 74 is turned off to allow PMOS transistor 54 to drive the gate positive.

Transistors 76, 78 are provided to help discharge the gate of PMOS transistor 70 when the voltage level of on/off node 16 goes high initially. Capacitor 80, connected between NAND gate 26 and inverter 28, sets operating frequency. In operation, NAND gate 26 maintains driving circuit 10 turned off when the voltage level of ENABLE node 16 is low. PMOS transistor 70 remains in the OFF state since transistor 54 pulls the gate of PMOS transistor 12 positive. The gate of PMOS transistor 70 is pulled up to the level of input voltage $V_{IN}$, for example.

When the voltage level of ENABLE node 16 becomes high, driving circuit 10 is then activated and enters into the charging phase, and the gate of PMOS transistor 70 is driven negative and the transistor is then turned on to reduce source-drain impedance.

In the charging phase, node Y is in high level, and thus, both electrodes of capacitor 72 are connected to input node 14 and ground GND, respectively, through PMOS transistor 20 and NMOS transistor 22. Accordingly, capacitor 72 is charged up to voltage $V_{IN}$ in this example.

When capacitor 72 is charged to voltage $V_{IN}$, NAND gate 26 switches the operating mode of driving circuit 10 from the charging phase to the driving phase. In the driving phase, node X is in high level, the bottom electrode of capacitor 72 is connected to the gate of PMOS transistor 70 through NMOS transistors 24, 74. Accordingly, the gate of PMOS 70 is driven negative (below GND) by connecting the top electrode of capacitor 72 to ground GND through NMOS transistor 42. This creates the low impedance path from $V_{IN}$ node 14 to output node 56, through PMOS transistor 70.

Once the top electrode of capacitor 72 drops within the negative threshold voltage of NAND gate 26, the operation mode of driving circuit 10 transitions to the charging phase from the driving phase.

When the voltage level of ENABLE node 16 becomes low, driving circuit 10 will then be disabled by NAND gate 26, and the gate of PMOS transistor 70 is pulled positive via PMOS transistor 54. This creates the high impedance path from $V_{IN}$ node 14 to output node 56 through PMOS transistor 70.

Figure 5:
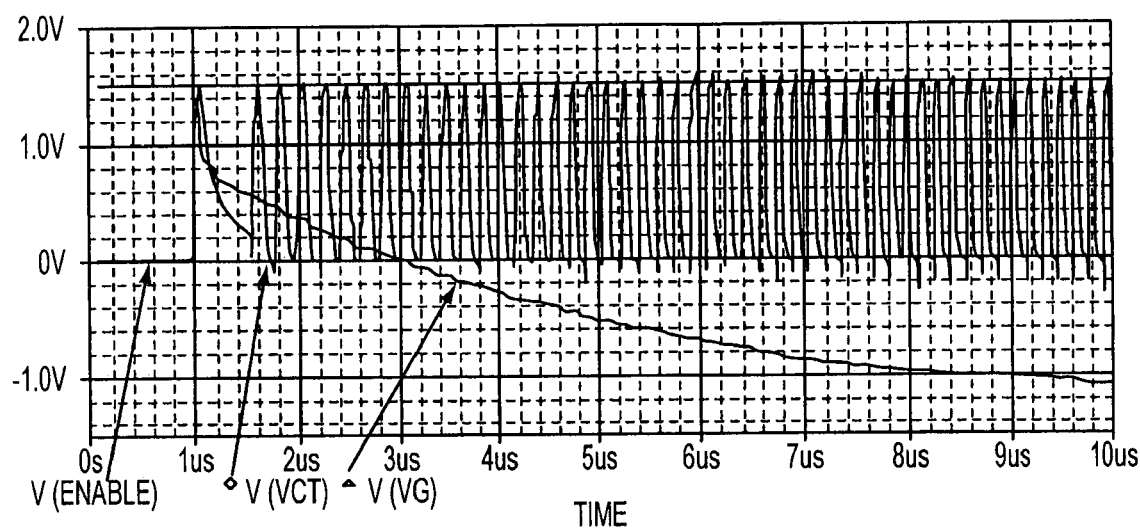
FIG. 5 is a diagram of waveforms for operation of the circuit of in FIG. 4.

FIG. 5 illustrates an example of operating waveforms of driving circuit 10 with input voltage $V_{IN}$ of 1.5V in this embodiment, where a voltage $V_{CT}$ of the top electrode of capacitor 72 and a gate voltage $V_G$ of PMOS transistor 70 are shown. According to FIG. 5, gate voltage $V_G$ of PMOS transistor 70 is lower than gate voltage $V_G$ of native NMOS transistor 12 shown in FIG. 2.

It will be appreciated by persons skilled in the art that the circuit topology shown in FIG. 4 can be applied to drive the gate of a native NMOS transistor to increase source-drain impedance. For example, this may be accomplished, for example, by replacing PMOS transistor 70 with a native NMOS transistor and modifying the circuit topology based on FIG. 1. In addition, it will be appreciated by persons skilled in the art that many design modifications may be made to the circuit topology shown in FIG. 4.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein.

For example, it would be possible to either provide an IC with an external negative supply or use a combination of internal and external components to generate a negative supply which could then be used to drive MOS gates as described in this disclosure. It would also be possible to generate the negative supply using inductive based approaches. The inductive based approaches may require external components. Any application that could benefit from additional headroom, such as a differential pair, could make use of the driving circuit (negative supply generator) described herein. It is also possible to envision applications that would benefit from an on chip boosted charge pump supply such as greater enhancement of an NMOS.

What is claimed is:

1. A circuit for driving a gate of a MOS transistor to a non-conductive state, comprising:
   a voltage input node for receiving a positive voltage;
   a signal input node for receiving an ENABLE signal;
   a negative voltage generator comprising a charge pump circuit;
   a logic circuit having an output coupled to the charge pump circuit; and
   a logic gate having a first input coupled to the signal input node, a second input coupled to the charge pump circuit, and an output coupled to the logic circuit;
   wherein the charge pump circuit is activated during a positive ENABLE signal to apply a negative voltage to the gate of the MOS transistor to prevent MOS transistor current conduction.

2. A circuit as recited in claim 1, wherein the MOS transistor, voltage input node, signal input node, and negative voltage generator are integrated in a single chip.

3. A circuit as recited in claim 1, wherein the logic gate is a NAND gate.

4. A circuit as recited in claim 1, wherein the charge pump circuit comprises:
   a capacitor;
   a current source for intermittently varying charge stored by the capacitor; and
   the logic circuit is responsive to the voltage of the capacitor, to couple the current source to, and decouple the current source from, the capacitor.

5. A circuit as recited in claim 1, wherein the MOS transistor is a native or low threshold voltage NMOS transistor, and the applied negative voltage increases source-drain impedance of the NMOS transistor.

6. A circuit as recited in claim 1, wherein the MOS transistor is a PMOS transistor, and the applied negative voltage reduces source-drain impedance of the PMOS transistor.

7. A circuit for driving a gate of a MOS transistor to a non-conductive state, comprising:
   a voltage input node for receiving a positive voltage;
   a signal input node for receiving an ENABLE signal; and
   a negative voltage generator, responsive to an ENABLE signal from the signal input node to apply a negative voltage to the gate of the MOS transistor to prevent MOS transistor current conduction,
   wherein the negative voltage generator comprises:
   a capacitor having a first electrode and a second electrode;
   a first switching device connected between the first capacitor electrode and the input node;
   a second switching device connected between the second capacitor electrode and a common potential;
   a third switching device connected between the second capacitor electrode and the gate of the MOS transistor;
   a fourth switching device connected between the first capacitor electrode and a current source; and
   a monitoring circuit responsive to the voltage of the first capacitor electrode for controlling the first to fourth switching devices to charge the capacitor and drive the gate voltage of the MOS transistor negative.

8. A circuit as recited in claim 7, wherein the MOS transistor is configured as an open-drain switch.

9. A circuit as recited in claim 7, further comprising:
   a fifth switching device connected between the input node and the gate of the MOS transistor for applying a positive voltage to the gate of the MOS transistor in response to a disable signal (NOT ENABLE) at the signal input node.

10. A circuit as recited in claim 7, wherein the MOS transistor is configured as a source follower.

11. A circuit as recited in claim 10, further comprising:
an amplifier connected to receive a reference voltage and an output of the MOS transistor; and
a fifth switching device connected between an output of the amplifier and the gate of the MOS transistor;
wherein the fifth switching device is controlled to conduct in response to a disable signal (NOT ENABLE) at the signal input node.

12. A circuit for driving a gate of a MOS transistor to a non-conductive state, comprising:
a voltage input node for receiving a positive voltage;
a signal input node for receiving an ENABLE signal; and
a negative voltage generator, responsive to an ENABLE signal from the signal input node to apply a negative voltage to the gate of the MOS transistor to prevent MOS transistor current conduction,
wherein the negative voltage generator comprises:
a capacitor having a first electrode and a second electrode;
a first switching device connected between the first capacitor electrode and the input node;
a second switching device connected between the second capacitor electrode and a common potential;
a third switching device connected between the second capacitor electrode and the gate of the MOS transistor;
a fourth switching device connected between the first capacitor electrode and the common potential; and
a monitoring circuit responsive to the voltage of the first capacitor electrode for controlling the first to fourth switching devices to charge the capacitor and drive the gate voltage of the MOS transistor negative.

13. A circuit as recited in claim 12, wherein the MOS transistor is a PMOS transistor configured as an open-drain switch.

14. A circuit as recited in claim 12, further comprising:
a fifth switching device connected between the input node and the gate of the MOS transistor for applying a positive voltage to the gate of the MOS transistor in response to a disable signal (NOT ENABLE) at the signal input node.

* * * * *